United States Patent
Fang et al.

(10) Patent No.: US 12,032,304 B2
(45) Date of Patent: Jul. 9, 2024

(54) CLEANING SYSTEM, EXPOSURE MACHINE, AND CLEANING METHOD

(71) Applicant: CHANGXIN MEMORY TECHNOLOGIES, INC., Hefei (CN)

(72) Inventors: Lulu Fang, Hefei (CN); Xueyu Liang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 176 days.

(21) Appl. No.: 17/839,824

(22) Filed: Jun. 14, 2022

(65) Prior Publication Data

US 2022/0308467 A1 Sep. 29, 2022

Related U.S. Application Data (63) Continuation of application No. PCT/CN2021/109064, filed on Jul. 28, 2021.

(30) Foreign Application Priority Data

Nov. 20, 2020 (CN) .......................... 202011313117.7

(51) Int. Cl.
*G03F 1/82* (2012.01)
*G03F 7/00* (2006.01)

(52) U.S. Cl.
CPC ............ *G03F 7/70925* (2013.01); *G03F 1/82* (2013.01)

(58) Field of Classification Search
CPC .................................................. G03F 7/70925
See application file for complete search history.

(56) References Cited

U.S. PATENT DOCUMENTS

| 7,916,269 | B2 | 3/2011 | De Jong |
| 7,986,395 | B2 | 7/2011 | Chang |
| 8,216,389 | B2 | 7/2012 | Yoshihara |
| 8,243,255 | B2 | 8/2012 | De Graaf |
| 8,605,250 | B2 | 12/2013 | Seltmann |

(Continued)

FOREIGN PATENT DOCUMENTS

| CN | 1955848 A | 5/2007 |
| CN | 101551602 A | 10/2009 |

OTHER PUBLICATIONS

International Search Report in the international application No. PCT/CN2021/109064, mailed on Nov. 2, 2021, 8 pages.

*Primary Examiner* — Jason Y Ko (74) *Attorney, Agent, or Firm* — Kilpatrick Townsend & Stockton LLP (57) ABSTRACT

A cleaning system is integrated in an exposure machine including an immersion cover and a workbench arranged to be movable in translation below immersion cover. The cleaning system includes an image acquisition component, a cleaning component, and a controller. The image acquisition component is configured to acquire image information of a through hole of immersion cover. The cleaning component includes a cleaning pipe disposed inside workbench and having a first end extending out of a top surface of workbench, and a vacuum pump connected to a second end of cleaning pipe. The controller is configured to judge whether through hole is blocked according to image information, control workbench to be moved in translation so that first end of cleaning pipe is located directly below blocked through hole, and control vacuum pump to apply a negative pressure to blocked through hole through cleaning pipe to clean immersion cover.

16 Claims, 3 Drawing Sheets

(56) References Cited

U.S. PATENT DOCUMENTS

| | | |
|---|---|---|
| 8,980,013 B2 | 3/2015 | Yoshihara |
| 9,019,466 B2 | 4/2015 | Leenders |
| 9,036,128 B2 | 5/2015 | De Graaf |
| 9,158,206 B2 | 10/2015 | De Jong |
| 9,405,205 B2 | 8/2016 | De Graaf |
| 9,599,908 B2 | 3/2017 | De Jong |
| 9,658,536 B2 | 5/2017 | Wu |
| 9,785,061 B2 | 10/2017 | De Graaf |
| 2007/0091287 A1 | 4/2007 | Chang |
| 2009/0025753 A1 | 1/2009 | De Jong |
| 2009/0027635 A1 | 1/2009 | De Jong |
| 2009/0027636 A1 | 1/2009 | Leenders |
| 2009/0195761 A1 | 8/2009 | De Graaf |
| 2009/0250079 A1 | 10/2009 | Yoshihara |
| 2010/0245790 A1 | 9/2010 | Seltmann |
| 2011/0188013 A1 | 8/2011 | De Jong |
| 2012/0234362 A1 | 9/2012 | Yoshihara |
| 2012/0281190 A1 | 11/2012 | De Graaf |
| 2015/0323875 A1 | 11/2015 | De Graaf et al. |
| 2016/0033875 A1 | 2/2016 | De Jong et al. |
| 2016/0342098 A1 | 11/2016 | De Graaf et al. |

CLEANING SYSTEM, EXPOSURE MACHINE, AND CLEANING METHOD

CROSS-REFERENCE TO RELATED APPLICATIONS

This application is a continuation application of International Patent Application No. PCT/CN2021/109064, filed on Jul. 28, 2021 and entitled "CLEANING SYSTEM, EXPOSURE MACHINE, AND CLEANING METHOD", which claims priority to Chinese Patent Application No. 202011313117.7, filed on Nov. 20, 2020 and entitled "CLEANING SYSTEM, EXPOSURE MACHINE, AND CLEANING METHOD". The contents of International Patent Application No. PCT/CN2021/109064 and Chinese Patent Application No. 202011313117.7 are hereby incorporated by reference in their entireties.

TECHNICAL FIELD

The present disclosure relates to the technical field of semiconductor manufacturing, and in particular to a cleaning system, an exposure machine, and a cleaning method.

BACKGROUND

Ultra-pure water exists in an immersion cover of an exposure machine, and a large number of water inlet holes and water outlet holes are needed when a stable water flow is maintained. When some water inlet holes or water outlet holes are blocked, the water flow in the immersion cover is unstable, and the problems of air bubbles or uneven water flow distribution exist, which cause surface defects of a wafer.

In order to detect and clean the blocked holes in the immersion cover, an existing solution for detecting the through holes of the immersion cover is as follows. The exposure machine is stopped, the holes of the immersion cover are detected one by one, and a pollution source is removed by manual cleaning when the blocked holes are found.

However, in the above existing detection and cleaning solution, by manually cleaning, assembling and disassembling the exposure machine, a large amount of workload is increased for engineers, and a structural damage is easy to occur in the assembling and disassembling process. Moreover, in the above existing solution, the exposure machine needs to be stopped before detection and cleaning, so that the exposure machine needs to be stopped and restarted for a long time, and the productivity of the exposure machine is seriously affected.

SUMMARY

According to an aspect of embodiments of the present disclosure, a cleaning system is provided. The cleaning system is integrated in the exposure machine. The exposure machine includes an immersion cover and a workbench arranged to be movable in translation below the immersion cover. The cleaning system includes an image acquisition component, a cleaning component, and a controller. The image acquisition component is disposed on a surface of the workbench and configured to acquire image information of a through hole of the immersion cover. The cleaning component includes a cleaning pipe and a vacuum pump. The cleaning pipe is disposed inside the workbench, a first end of the cleaning pipe extends out of a top surface of the workbench, and the vacuum pump is connected to a second end of the cleaning pipe. The controller is electrically connected to the image acquisition component and the vacuum pump. The controller is configured to judge whether the through hole is blocked according to the image information, to control the workbench to be moved in translation so that the first end of the cleaning pipe is located directly below the blocked through hole, and to control the vacuum pump to apply a negative pressure to the blocked through hole through the cleaning pipe to clean the immersion cover.

According to another aspect of embodiments of the present disclosure, an exposure machine is provided. The exposure machine includes a workbench and an immersion cover. The workbench is arranged to be movable in translation below the immersion cover. The exposure machine further includes the cleaning system proposed by the embodiments of the present disclosure and described in detail in the above embodiments.

According to another aspect of embodiments of the present disclosure, a cleaning method is provided. The cleaning method is applied to an exposure machine including the cleaning system proposed by the embodiments of the present disclosure and described in the above embodiments. The cleaning method includes the following operations. An image acquisition component acquires image information of a through hole of an immersion cover. A controller judges whether the through hole is blocked according to the image information. The controller controls a workbench to be moved in translation so that a first end of a cleaning pipe is located directly below the blocked through hole. The controller controls a vacuum pump to apply a negative pressure to the blocked through hole through the cleaning pipe to clean the immersion cover.

DETAILED DESCRIPTION

Exemplary embodiments will now be described more fully with reference to the accompanying drawings. However, the exemplary embodiments can be implemented in a variety of forms and should not be construed as a limitation to the embodiments set forth herein. Rather, these embodiments are provided so that the present disclosure will be thorough and complete, and the concepts of the exemplary embodiments are fully communicated to those skilled in the art. The same reference numerals in the figures indicate the same or similar structures, and thus the detailed descriptions thereof are omitted.

Figure 1:
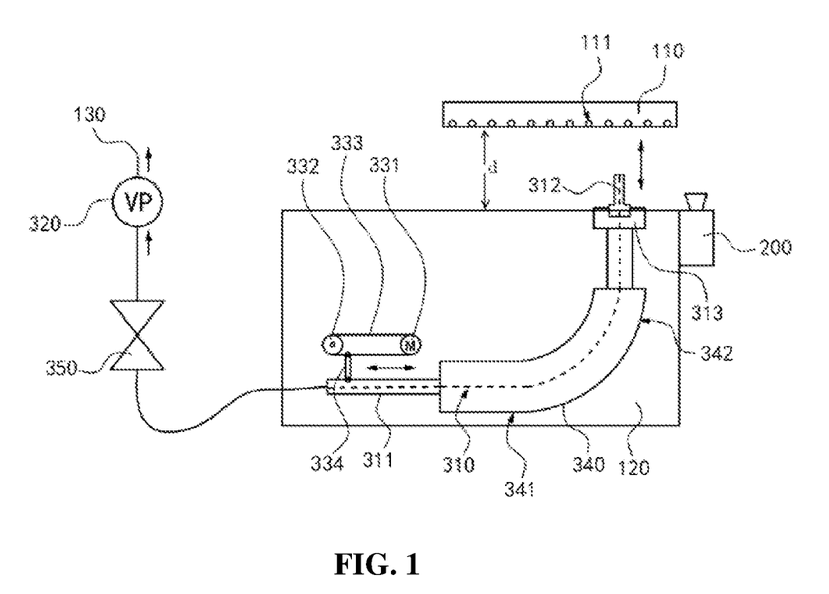
FIG. 1 is a schematic view of an arrangement in which a cleaning system is disposed on an exposure machine according to an exemplary embodiment.

Referring to FIG. 1, a schematic view of an arrangement in which a cleaning system proposed by the present disclosure is disposed on an exposure machine is representatively shown. In this exemplary embodiment, the cleaning system proposed by the present disclosure is illustrated as being applied to an exposure machine. Those skilled in the art will readily appreciate that numerous modifications, additions, substitutions, deletions, or other changes to specific embodiments described below may be made to apply the relevant design of the present disclosure to other types of equipment or other processes while remaining within the scope of the principles of the cleaning system proposed by the present disclosure.

Figure 2:
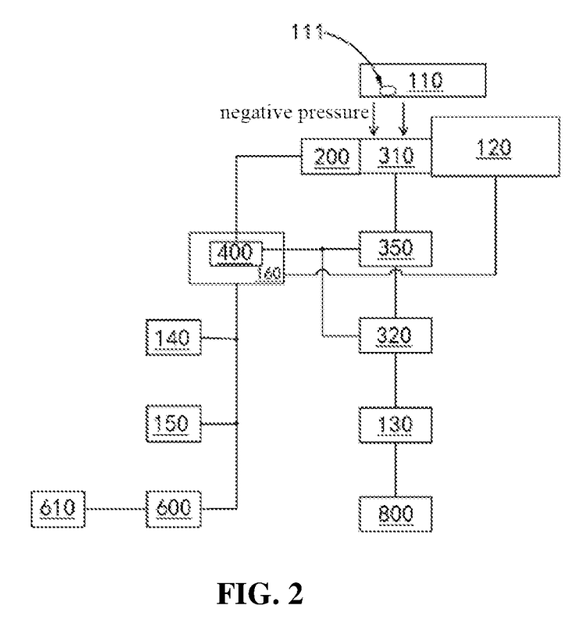
FIG. 2 is a block diagram of the cleaning system shown in FIG. 1.
Figure 3:
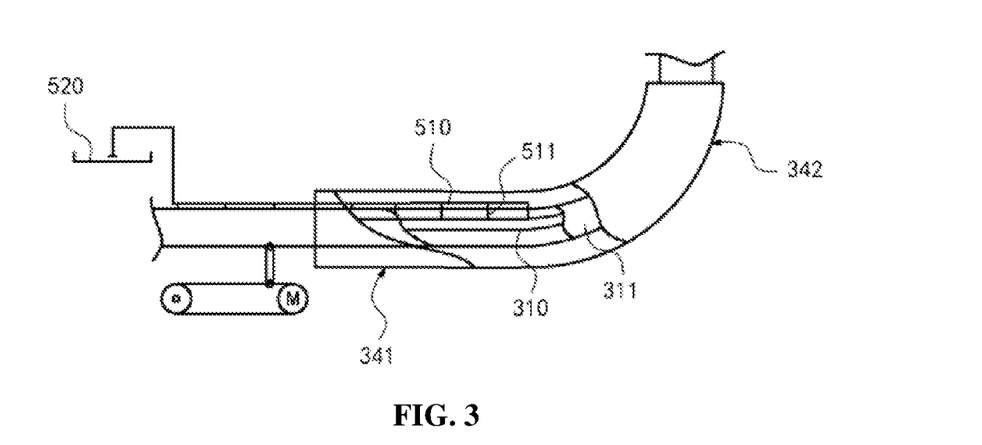
FIG. 3 is a schematic view of an arrangement in which a cleaning system is disposed on an exposure machine according to another exemplary embodiment.
Figure 4:
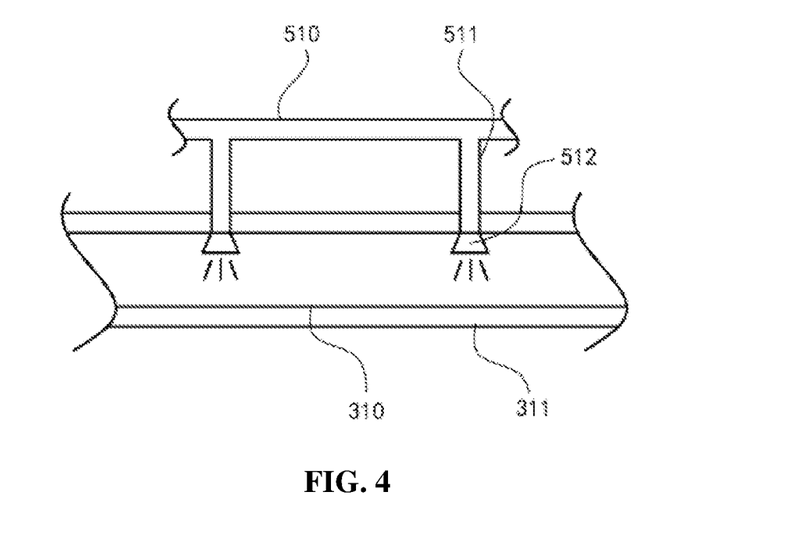
FIG. 4 is a partially enlarged view of the cleaning system shown in FIG. 3.

As shown in FIG. 1, in the present embodiment, the cleaning system proposed by the present disclosure can be integrated in an exposure machine including a workbench 120 and an immersion cover 110. The workbench 120 is arranged to be movable in translation below the immersion cover 110. The cleaning system includes an image acquisition component 200, a cleaning component, and a controller 400. Referring to FIGS. 2-4, a block diagram of a cleaning system capable of embodying the principles of the present disclosure is representatively shown in FIG. 2. Another exemplary embodiment capable of embodying the principles of the present disclosure is representatively shown in FIG. 3, and a schematic view of an arrangement in which a cleaning system is disposed on an exposure machine in this embodiment is specifically shown. A partially enlarged view of FIG. 3 is representatively shown in FIG. 4. The structure, connection manner, and functional relationship of major components of the cleaning system proposed by the present disclosure will now be described in detail with reference to the above drawings.

As shown in FIGS. 1 and 2, in the present embodiment, the image acquisition component 200 is disposed on a surface of the workbench 120, and the image acquisition component 200 is configured to acquire image information of through holes 111 of the immersion cover 110. The cleaning component includes a cleaning pipe 310 and a vacuum pump 320. The cleaning pipe 310 is disposed inside the workbench 120. One end of the cleaning pipe 310 extends out of a top surface of the workbench 120. The vacuum pump 320 is connected to another end of the cleaning pipe 310. For convenience of description, the one end of the cleaning pipe 310 extending out of the top surface of the workbench 120 is defined as a first end and the another end of the cleaning pipe 310 is defined as a second end. The controller 400 is electrically connected to the image acquisition component 200 and the vacuum pump 320. Accordingly, the controller 400 is configured to judge whether the through holes 111 are blocked according to the image information acquired by the image acquisition component 200. If it is determined that a certain through hole 111 is blocked, the controller 400 is configured to control the workbench 120 to be moved in translation so that the first end of the cleaning pipe 310 is located directly below the blocked through hole 111, and to control the vacuum pump 320 to apply a negative pressure to the blocked through hole 111 through the cleaning pipe 310 to clean the immersion cover 110. For convenience of description, the blocked through hole 111 to be cleaned is defined below as a target through hole.

On the premise that the exposure machine does not need to be stopped, a real-time condition of the through holes 111 of the immersion cover 110 can be detected through the above design in the present disclosure, and the productivity problem caused by stopping, assembling and disassembling the exposure machine is reduced. Moreover, the blocked through hole 111 of the immersion cover 110 can be automatically cleaned in the present disclosure, and huge labor waste caused by disassembly and assembly and manual cleaning is avoided. The cleaning system proposed by the present disclosure has the advantages of high blockage detection efficiency, timely and accurate detection, automatic cleaning, etc.

In addition, taking the process of "gluing, exposing and developing" of a wafer as an example, an existing detection solution is to judge, after a defect occurs in a developed final product, whether the product defect is caused due to blockage of the through holes 111 of the immersion cover 110 in an exposure stage, to stop the exposure machine, and then to manually clean the through holes 111 of the immersion cover 110. In contrast, there are essential differences and significant differences between the cleaning system proposed by the present disclosure and the existing solution. In the present disclosure, the through holes 111 of the immersion cover 110 are detected directly, conveniently and accurately in real time without stopping the exposure machine. Once it is found that the through hole 111 is blocked, direct cleaning can be achieved without stopping, the detection and cleaning functions of cleaning upon finding are realized, and the immersion cover 110 with the blocked through hole 111 is prevented from continuously affecting the final yield of products in one or even more batches.

Optionally, as shown in FIG. 1, in the present embodiment, the cleaning component may further include a drive mechanism. Specifically, the drive mechanism is disposed inside the workbench 120. The drive mechanism is configured to drive the cleaning pipe 310 to be moved so that the first end of the cleaning pipe 310 is retractable and extends out of the top surface of the workbench 120. That is, the stroke of the cleaning pipe 310 extending out of the top surface of the workbench 120 can be adjusted and controlled. For example, a distance d between the immersion cover 110 and the workbench 120 is 5 cm, and the first end of the cleaning pipe 310 is substantially flush with the top surface of the workbench 120 when the cleaning pipe 310 does not perform a cleaning action. In this case, if the first end of the cleaning pipe 310 is required to be in contact with the immersion cover 110 during the cleaning, the drive mechanism drives the cleaning pipe 310 by a stroke of substantially 5 cm. On this basis, the controller 400 is electrically connected to the drive mechanism, and the controller 400 is configured to control the drive mechanism to drive the cleaning pipe 310, so that the first end of the cleaning pipe 310 is in communication with the target through hole. The cleaning pipe 310 can be adjusted and controlled to be retractable through the above design in the present disclosure. When the cleaning component does not work, the influence on the normal operation of the immersion cover 110 is avoided by retracting the cleaning pipe 310, and when the cleaning component works, the proximity or contact between the cleaning pipe 310 and the target through hole is realized by extending the cleaning pipe 310 out, so that a negative pressure environment acts on the target through hole more fully, and the cleaning effect is further optimized.

As described above, in the present embodiment, the cleaning pipe 310 may be a plastic hose so that it is not broken during the bending movement between a horizontal direction and a vertical direction. The above bending design will be described below, and descriptions thereof are omitted herein. In other embodiments, the cleaning pipe 310 may also be a hose made of other materials or a rigid pipe, which is not limited in the present embodiment.

Further, as shown in FIG. 1, based on the design that the cleaning component includes a drive mechanism, in the present embodiment, the cleaning pipe 310 may be provided with a drive fixing structure 311. The drive fixing structure 311 is connected to the drive mechanism, so that the drive mechanism drives the cleaning pipe 310 to be moved through the drive fixing structure 311. The drive fixing structure 311 may be, for example, a support or a rigid pipe member, and the cleaning pipe 310 may be partially disposed on or inserted into the support or rigid pipe member. Through the above design, since the cleaning pipe 310 is a plastic hose in the present embodiment, the drive fixing structure 311 can form a structural connection between the soft cleaning pipe 310 and the drive mechanism, which further optimizes the effect of driving the cleaning pipe 310.

Further, as shown in FIG. 1, based on the design that the cleaning component includes the drive mechanism, in the present embodiment, the drive mechanism may include a motor, a driving wheel, a driven wheel 332, and a transmission belt 333. Specifically, the motor is disposed on the workbench 120 and configured to drive the driving wheel 331. The driven wheel 332 is disposed on the workbench 120. The transmission belt 333 is arranged between the driving wheel 331 and the driven wheel 332 for drivingly connecting the driving wheel 331 and the driven wheel 332 with each other. On this basis, the cleaning pipe 310 may be connected to the transmission belt 333 through a connecting member 334.

Further, as shown in FIG. 1, based on the design that the drive mechanism includes the transmission belt 333 and the cleaning pipe 310 is provided with the drive fixing structure 311, in the present embodiment, the drive fixing structure 311 may be connected to the transmission belt 333 through the connecting member.

Further, based on the design that the drive mechanism includes the motor, in the present embodiment, the motor may be a micro-motor.

Optionally, as shown in FIG. 1, in the present embodiment, the first end of the cleaning pipe 310 may be provided with a joint 312. Correspondingly, the top surface of the workbench 120 may be provided with a fastening member 313. On this basis, the joint 312 disposed at the first end of the cleaning pipe 310 passes through the fastening member 313, and the fastening member 313 and the joint 312 cooperate with each other to unidirectionally limit a movement of the joint 312 (i.e. the fastening member 313 prevents the joint 312 from being retracted downwards).

Optionally, as shown in FIG. 1, in the present embodiment, the cleaning component may further include a positioning guide pipe 340. Specifically, the positioning guide pipe 340 is disposed inside the workbench 120 and provided with a first section 341 and a second section 342. The first section 341 extends in the horizontal direction. One end of the second section 342 is connected to the first section 341, and another end of the second section 342 bends upwards. The cleaning pipe 310 is arranged in the positioning guide pipe 340, so that the first end of the cleaning pipe 310 extends out of the top surface of the workbench 120 in a vertical direction and the second end of the cleaning pipe 310 extends in the horizontal direction.

It should be noted that as illustrated in the present embodiment, the first end of the cleaning pipe 310 extends in the vertical direction, and the second end of the cleaning pipe 310 extends in the horizontal direction and is connected to the vacuum pump 320. In other embodiments, the second end of the cleaning pipe 310 may also extend in other directions, such as an inclined direction or the vertical direction, which is not limited to the horizontal direction in the present embodiment, on the basis of the structure in which the immersion cover 110 is located above the workbench 120, while ensuring that the first end of the cleaning pipe 310 extends in the vertical direction. In other words, the design in which the second end of the cleaning pipe 310 extends in the horizontal direction in the present embodiment can be adapted to arrange the vacuum pump 320 in approximately the same horizontal plane as the workbench 120. In other embodiments, the extension direction of the cleaning pipe 310 may be flexibly adjusted according to different arrangement requirements. For example, if the vacuum pump 320 is arranged below the workbench 120, the second end of the cleaning pipe 310 may also extend downwards in the vertical direction, and on this basis, the above positioning guide pipe 340 may not be disposed, which is not limited in the present embodiment.

Optionally, as shown in FIGS. 1 and 2, in the present embodiment, the cleaning component may further include a control valve group 350. The control valve group 350 is disposed on the cleaning pipe 310. On this basis, the controller 400 is electrically connected to the control valve group 350, and the controller 400 is configured to control the control valve group 350 to adjust the opening and closing and the flow rate (a negative pressure flow rate for vacuumizing) of the cleaning pipe 310.

Further, based on the design that the cleaning component includes the control valve group 350, in the present embodiment, the control valve group 350 may include a solenoid valve.

Optionally, in the present embodiment, the negative pressure flow rate at which the vacuum pump 320 vacuumizes through the cleaning pipe 310 may be 10 L/min-30 L/min, such as 10 L/min, 15 L/min, 25 L/min, or 30 L/min. In other embodiments, the negative pressure flow rate for vacuumizing through the cleaning pipe 310 may be less than 10 L/min, or may be greater than 30 L/min, such as 9 L/min or 32 L/min, which is not limited in the present embodiment.

Further, based on the design that the negative pressure flow rate for vacuumizing through the cleaning pipe 310 is 10 L/min-30 L/min, in the present embodiment, the negative pressure flow rate for vacuumizing through the cleaning pipe 310 may be further 20 L/min.

Optionally, as shown in FIG. 2, in the present embodiment, the vacuum pump 320 may be specifically connected to the second end of the cleaning pipe 310 through a suction end of the vacuum pump 320. For an exhaust end of the vacuum pump 320, the exhaust end may be connected to an external purification device through an exhaust pipe 130 to realize collection and purification of exhaust gas during vacuumizing. The exhaust pipe 130 may be an exhaust pipe 130 of the exposure machine, and the external purification device may be a facility purification device 700 to which the exposure machine is connected.

Optionally, in the present embodiment, the image acquisition component 200 may directly acquire an image of the entire bottom of the immersion cover 110 and send corresponding image information to the controller 400. Accordingly, the controller 400 configured to compare image information representing the entire bottom of the immersion cover 110. For example, the image information may be uploaded to a server 600 to retrieve a pollution blockage position. After a specific position of the target through hole is determined, the controller 400 sends a control instruction to perform translation of the workbench 120 and cleaning of the cleaning component.

Optionally, in the present embodiment, the image acquisition component 200 may include a camera. In other embodiments, the image acquisition component 200 may also include an image acquisition device such as a CCD image sensor or an infrared sensor, which is not limited in the present embodiment.

Further, based on the design that the image acquisition component 200 includes the camera, in the present embodiment, the camera may have a zoom function. Through the above design, zoom acquiring can be realized by the camera in the present embodiment, collection of image information is further optimized, and the through holes 111 of the immersion cover 110 can be more accurately and sensitively detected. In other embodiments, when the image acquisition component 200 includes a camera, the camera may also have other camera acquiring functions according to different acquiring needs, which is not limited in the present embodiment.

Further, based on the design that the image acquisition component 200 includes the camera, in the present embodiment, the camera may have a resolution greater than or equal to 720 p, such as 720 p or 1080 p. Through the above design, high-definition images can be acquired by the camera in the present embodiment, collection of image information is further optimized, and the through holes 111 of the immersion cover 110 can be more accurately and sensitively detected.

Optionally, in the present embodiment, the image acquisition component 200 may be powered by a power supply of the exposure machine, or may be equipped with an independent power supply itself.

Optionally, in the present embodiment, the image acquisition component 200 may be disposed on a side surface of the workbench 120, and the image acquisition component 200 may be arranged adjacent to the first end (e.g., the fastening member 313) of the cleaning pipe 310. For example, the image acquisition component 200 and the cleaning component may be disposed on a side surface at the same side of the workbench 120. On this basis, the fastening member 313 is adjacent to the image acquisition component 200. Through the above design, when the image acquisition component 200 performs image acquisition on a certain through hole 111 and the controller 400 determines that the through hole 111 is blocked, since the first end of the cleaning pipe 310 is connected to the image acquisition component 200, the workbench 120 does not need to be driven to be translated again, the cleaning component can be directly controlled to perform a cleaning action, thereby further improving the working efficiency of the present disclosure.

Optionally, in the present embodiment, the controller 400 may prestore image reference information capable of representing an image when the through hole 111 of the immersion cover 110 is not blocked. Accordingly, the controller 400 compares the image reference information with the image information acquired by the image acquisition component 200 to judge whether the through hole 111 of the immersion cover 110 is blocked.

Optionally, in the present embodiment, the cleaning system proposed by the present disclosure may also perform feedback-controlled cleaning actions based on product defects exhibited by a final product. Specifically, when an automatic system 150 of a wafer production line extracts wafer surface defect detection information (e.g., WIS image) of a developer, it can be judged whether the through holes 111 of the immersion cover 110 of the exposure machine are blocked. When it is determined that the through holes 111 of the immersion cover 110 are blocked, the controller 400 may control the workbench 120 to be moved in translation below the immersion cover 110 according to the feedback of the automatic system 150, and control the image acquisition component 200 to perform image information acquisition on the through holes 111 of the immersion cover 110. The controller 400 may accordingly judge whether each through hole 111 is blocked through an image algorithm. If a certain through hole 111 is blocked, the controller 400 controls the cleaning component to perform a cleaning action.

Optionally, in the present embodiment, the controller 400 may be integrated into a control system 160 of the exposure machine, e.g. a CPU of the exposure machine. On this basis, the controller 400 can be respectively connected to the automatic system 150 of the production line and the server 600 through the control system 160 of the exposure machine, and can realize information interaction and remote control with a terminal device 610 such as a personal PC, a cell phone, or a Pad through the server 600. In addition, the controller 400 may be connected to an interactive interface 140 of the exposure machine, such as a control panel and a display screen of the exposure machine, for displaying a monitoring result and a cleaning state.

Optionally, in the present embodiment, when the exposure machine exposes wafers in successive batches, the automatic system 150 of the production line sends an instruction to the control system 160 of the exposure machine. Accordingly, the controller 400 of the cleaning system is capable of controlling the image acquisition component 200 and the cleaning component to detect and clean the immersion cover 110 within an interval idle time of adjacent batches of the exposure machine.

Optionally, in the present embodiment, the controller 400 may have a periodic information feedback function. For example, a time interval may be preset in the controller 400, the immersion cover 110 of the exposure machine may be periodically monitored at the time interval, and information may be fed back to the automatic system 150 of the production line and assist in judging whether cleaning is required, thereby contributing to the prevention of product defects.

Optionally, in the present embodiment, the controller 400 may upload data of each detection and cleaning to the server 600, the server 600 may calculate the regularity of the blockage of the through holes 111 of the immersion cover 110 using an algorithm of large data, and accordingly, maintenance items for the regularity of the blockage may be correspondingly added during maintenance of the exposure machine, thereby reducing the occurrence probability of blockage of the through holes 111.

Based on the above detailed description of an exemplary embodiment of the cleaning system proposed by the present disclosure, another exemplary embodiment of the cleaning system proposed by the present disclosure will be described below in conjunction with FIGS. 3 and 4.

As shown in FIGS. 3 and 4, a schematic view of an arrangement in which a cleaning system is disposed on an exposure machine in this embodiment is representatively shown in FIG. 3. A partially enlarged view of a cleaning pipe 310 is representatively shown in FIG. 4. The cleaning system proposed by the present disclosure is of substantially the same design as in the first embodiment described above. The main differences between the present embodiment and the first embodiment described above will be described below.

As shown in FIGS. 3 and 4, in the present embodiment, the cleaning system proposed by the present disclosure may further include a self-cleaning component. Specifically, the self-cleaning component includes a self-cleaning pipe 510 and a cleaning solution source 520. The self-cleaning pipe 510 is connected to the cleaning pipe 310 through a plurality of ports 511. The cleaning solution source 520 is connected to the self-cleaning pipe 510 to store and supply a cleaning solution. On this basis, the controller 400 is electrically connected to the cleaning solution source 520, and the controller 400 is configured to control the cleaning solution source 520 to convey the cleaning solution to the self-cleaning pipe 510 and spray the cleaning solution into the cleaning pipe 310 through the plurality of ports 511. Through the above design, a self-cleaning function of the cleaning system can be realized through the self-cleaning component in the present disclosure, so that the continuous use time of equipment is prolonged, the maintenance count and frequency of the cleaning system are reduced, and the working efficiency is further improved.

Optionally, in the present embodiment, the cleaning solution may include alcohol. On this basis, the cleaning solution source 520 may be an alcohol tank.

Optionally, as shown in FIG. 4, in the present embodiment, an end of each port 511 connected to the cleaning pipe 310 may be provided with a spray structure 512. Accordingly, as the cleaning solution enters the cleaning pipe 310 from the self-cleaning pipe 510 via the port 511, the cleaning solution can be sprayed into the cleaning pipe 310 in atomized form by flowing through the spray structure 512. Through the above design, the spray coverage area of the cleaning solution to an inner wall of the cleaning pipe 310 can be further increased, thereby further optimizing the self-cleaning function of the present disclosure.

In summary, the cleaning system proposed by the present disclosure includes an image acquisition component, a cleaning component, and a controller. The controller is configured to judge whether a through hole of an immersion cover is blocked according to image information acquired by the image acquisition component, and to control the cleaning system to apply a negative pressure to the blocked through hole, so that the pollution caused by the blockage of the through hole is eliminated. Through the above design, on the premise that the exposure machine does not need to be stopped, a real-time condition of the through holes of the immersion cover can be detected in the present disclosure, and the productivity problem caused by stopping, assembling and disassembling the exposure machine is reduced. Moreover, the blocked through hole of the immersion cover can be automatically cleaned in the present disclosure, and huge labor waste caused by disassembly and assembly and manual cleaning is avoided. The cleaning system proposed by the present disclosure has the advantages of high blockage detection efficiency, timely and accurate detection, automatic cleaning, etc.

Based on the above detailed description of an exemplary embodiment of the cleaning system proposed by the present disclosure, an exemplary embodiment of an exposure machine proposed by the present disclosure will be described below.

In the present embodiment, the exposure machine proposed by the present disclosure may include a workbench, an immersion cover, and the cleaning system proposed by the present disclosure and described in detail in the above embodiments. Specifically, the workbench is arranged to be movable in translation below the immersion cover. A cleaning pipe of the cleaning system is disposed on the workbench. A first end of the cleaning pipe extends out of a top surface of the workbench. A vacuum pump is connected to a second end of the cleaning pipe. A controller of the cleaning system is electrically connected to an image acquisition component and the vacuum pump. Accordingly, the controller is configured to judge whether the through holes are blocked according to the image information acquired by the image acquisition component. If it is determined that a certain through hole is blocked, the controller is configured to control the workbench to be moved in translation so that the first end of the cleaning pipe is located directly below the blocked through hole, and to control the vacuum pump to apply a negative pressure to the blocked through hole through the cleaning pipe to clean the immersion cover. Through the above design, the exposure machine proposed by the present disclosure has the advantages of high productivity, low labor consumption for detection and cleaning, and high product yield.

In summary, with the adoption of the cleaning system proposed by the present disclosure, the through holes of the immersion cover can be detected and cleaned without stopping the exposure machine according to the present disclosure. Through the above design, the exposure machine proposed by the present disclosure has the advantages of high productivity, low labor consumption for detection and cleaning, and high product yield.

Based on the above detailed description of several exemplary embodiments of the cleaning system and the exposure machine proposed by the present disclosure, an exemplary embodiment of a cleaning method proposed by the present disclosure will be described below.

In the present embodiment, the cleaning method proposed by the present disclosure may be applied to an exposure machine including the cleaning system proposed by the present disclosure and described in detail in the above embodiments. The cleaning method includes the following operations.

An image acquisition component acquires image information of a through hole of an immersion cover.

A controller judges whether the through hole is blocked according to the image information.

The controller controls a workbench to be moved in translation so that a first end of a cleaning pipe is located directly below the blocked through hole.

The controller controls a vacuum pump to apply a negative pressure to the blocked through hole through the cleaning pipe to clean the immersion cover.

In summary, according to the cleaning method proposed by the present disclosure, the cleaning system proposed by the present disclosure is adopted to detect and clean the through holes of the immersion cover of the exposure machine, so that the through holes of the immersion cover can be detected and cleaned without stopping the exposure machine. Through the above design, the cleaning method proposed by the present disclosure can ensure the productivity of the exposure machine, reduce the detection and cleaning labor consumption and improve the product yield while realizing the cleaning function.

Although the present disclosure has been described with reference to several typical examples, it should be understood that the terms used are the terms of description and illustration, rather than of limitation. As the present disclosure may be embodied in several forms without departing from the spirit or essence thereof, it should be understood that the above examples are not limited by any of the details of the foregoing description, but rather should be construed broadly within its spirit and scope as defined in the appended claims, and therefore all changes and modifications that fall within the claims or equivalences thereof should be embraced by the appended claims.

The invention claimed is:

1. A cleaning system, integrated in an exposure machine, the exposure machine comprising an immersion cover and a workbench arranged to be movable in translation below the immersion cover, the cleaning system comprising:
   an image acquisition component, disposed on a surface of the workbench and configured to acquire image information of a through hole of the immersion cover;
   a cleaning component, comprising a cleaning pipe and a vacuum pump, wherein the cleaning pipe is disposed inside the workbench, a first end of the cleaning pipe extends out of a top surface of the workbench, and the vacuum pump is connected to a second end of the cleaning pipe; and
   a controller, electrically connected to the image acquisition component and the vacuum pump,
   wherein the controller is configured to judge whether the through hole is blocked according to the image information, to control the workbench to be moved in translation so that the first end of the cleaning pipe is located directly below the blocked through hole, and to control the vacuum pump to apply a negative pressure to the blocked through hole through the cleaning pipe to clean the immersion cover.

2. The cleaning system of claim 1, wherein the cleaning component further comprises:
   a drive mechanism, disposed inside the workbench and configured to drive the cleaning pipe to be moved so that the first end of the cleaning pipe is retractable and extends out of the top surface of the workbench,
   wherein the controller is electrically connected to the drive mechanism to control the drive mechanism to drive the cleaning pipe, so that the first end of the cleaning pipe is in communication with the blocked through hole.

3. The cleaning system of claim 2, wherein the cleaning pipe is provided with a drive fixing structure, and the drive fixing structure is connected to the drive mechanism, so that the drive mechanism drives the cleaning pipe to be moved through the drive fixing structure.

4. The cleaning system of claim 2, wherein the drive mechanism comprises a motor, a driving wheel, a driven wheel, a transmission belt, and a connecting member, the motor is configured to drive the driving wheel, the driving wheel is in transmission connection with the driven wheel through the transmission belt, and the connecting member is arranged between the transmission belt and the cleaning pipe for connecting the transmission belt and the cleaning pipe with each other.

5. The cleaning system of claim 1, wherein a joint is disposed at the first end of the cleaning pipe extending out of the top surface of the workbench, a fastening member is disposed on the top surface of the workbench, the joint disposed at the first end of the cleaning pipe passes through the fastening member, the fastening member and the joint cooperate with each other to unidirectionally limit a movement of the joint.

6. The cleaning system of claim 1, wherein the cleaning component further comprises:
   a positioning guide pipe, disposed inside the workbench and provided with a first section and a second section, the first section extending in a horizontal direction, one end of the second section being connected to the first section, and another end of the second section bending upwards,
   wherein the cleaning pipe is arranged in the positioning guide pipe, so that the first end of the cleaning pipe extends out of the top surface of the workbench in a vertical direction and the second end of the cleaning pipe extends in the horizontal direction.

7. The cleaning system of claim 1, wherein the cleaning component further comprises:
   a control valve group, disposed on the cleaning pipe,
   wherein the controller is electrically connected to the control valve group to control the control valve group to adjust opening and closing and a flow rate of the cleaning pipe.

8. The cleaning system of claim 1, wherein the vacuum pump vacuumizes through the cleaning pipe at a negative pressure flow rate of 10 L/min-30 L/min.

9. The cleaning system of claim 1, wherein the image acquisition component is a camera with a zoom function.

10. The cleaning system of claim 1, wherein the image acquisition component is a camera with a resolution greater than or equal to 720 p.

11. The cleaning system of claim 1, wherein the image acquisition component is disposed on a side surface of the workbench, and arranged adjacent to the first end of the cleaning pipe extending out of the top surface of the workbench.

12. The cleaning system of claim 1, wherein the controller prestores image reference information representing an image when the through hole of the immersion cover is not blocked, and the controller compares the image reference information with the image information acquired by the image acquisition component to judge whether the through hole is blocked.

13. The cleaning system of claim 1, further comprising a self-cleaning component comprising:
   a self-cleaning pipe, connected to the cleaning pipe through a plurality of ports; and
   a cleaning solution source, connected to the self-cleaning pipe and configured to store and supply a cleaning solution,
   wherein the controller is electrically connected to the cleaning solution source to control the cleaning solution source to convey the cleaning solution to the self-cleaning pipe and spray the cleaning solution into the cleaning pipe through the plurality of ports.

14. The cleaning system of claim 13, wherein the cleaning solution comprises alcohol.

15. The cleaning system of claim 13, wherein an end of each port connected to the cleaning pipe is provided with a spray structure, so that the cleaning solution flowing through the spray structure is sprayed into the cleaning pipe in atomized form.

16. An exposure machine, comprising a workbench and an immersion cover, the workbench being arranged to be movable in translation below the immersion cover, the exposure machine further comprising a cleaning system, the cleaning system comprising:
   an image acquisition component, disposed on a surface of the workbench and configured to acquire image information of a through hole of the immersion cover;
   a cleaning component, comprising a cleaning pipe and a vacuum pump, wherein the cleaning pipe is disposed inside the workbench, a first end of the cleaning pipe extends out of a top surface of the workbench, and the vacuum pump is connected to a second end of the cleaning pipe; and
   a controller, electrically connected to the image acquisition component and the vacuum pump,
   wherein the controller is configured to judge whether the through hole is blocked according to the image information, to control the workbench to be moved in translation so that the first end of the cleaning pipe is located directly below the blocked through hole, and to control the vacuum pump to apply a negative pressure to the blocked through hole through the cleaning pipe to clean the immersion cover.

\* \* \* \* \*